United States Patent
Ohkubo

(10) Patent No.: US 12,236,619 B2
(45) Date of Patent: Feb. 25, 2025

(54) PROCESSING APPARATUS

(71) Applicant: DISCO CORPORATION, Tokyo (JP)

(72) Inventor: Hironari Ohkubo, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 464 days.

(21) Appl. No.: 17/805,172

(22) Filed: Jun. 2, 2022

(65) Prior Publication Data
US 2022/0398753 A1   Dec. 15, 2022

(30) Foreign Application Priority Data

Jun. 14, 2021 (JP) .................................. 2021-098677

(51) Int. Cl.
| | |
|---|---|
| *G06K 9/00* | (2022.01) |
| *G06T 3/4038* | (2024.01) |
| *G06T 7/00* | (2017.01) |
| *G06T 7/32* | (2017.01) |
| *H01L 21/67* | (2006.01) |

(52) U.S. Cl.
CPC .............. *G06T 7/32* (2017.01); *G06T 3/4038* (2013.01); *G06T 7/0004* (2013.01); *H01L 21/67092* (2013.01); *G06T 2207/30148* (2013.01)

(58) Field of Classification Search
CPC ........................................... G06T 2207/30148
See application file for complete search history.

(56) References Cited

FOREIGN PATENT DOCUMENTS

| JP | 05315444 A | 11/1993 | |
|---|---|---|---|
| JP | 2004322168 A | * 11/2004 | ......... B23K 26/0853 |
| JP | 2020136555 A | 8/2020 | |
| KR | 101561785 B1 | * 10/2015 | ............ H01L 22/00 |

OTHER PUBLICATIONS

Office Action issued in counterpart German patent application No. 10 2022 205 755.4, dated Sep. 19, 2024.

* cited by examiner

*Primary Examiner* — Molly Wilburn
*Assistant Examiner* — Aidan Keup
(74) *Attorney, Agent, or Firm* — Greer Burns & Crain Ltd.

(57) ABSTRACT

A control unit of a processing apparatus detects a linear region corresponding to a first planned dividing line from an intersection region of the first planned dividing line and a second planned dividing line, obtains an angle between the linear region and an X-axis direction, and positions the linear region corresponding to the first planned dividing line in the X-axis direction. A linear region corresponding to a next first planned dividing line is detected and an interval between the first planned dividing lines is set. A second planned dividing line interval setting section detects two linear regions corresponding to second planned dividing lines, the linear regions being adjacent to each other, and an interval is set between the second planned dividing lines. A device image enclosed by a pair of first planned dividing lines and a pair of second planned dividing lines is generated and stored.

2 Claims, 7 Drawing Sheets

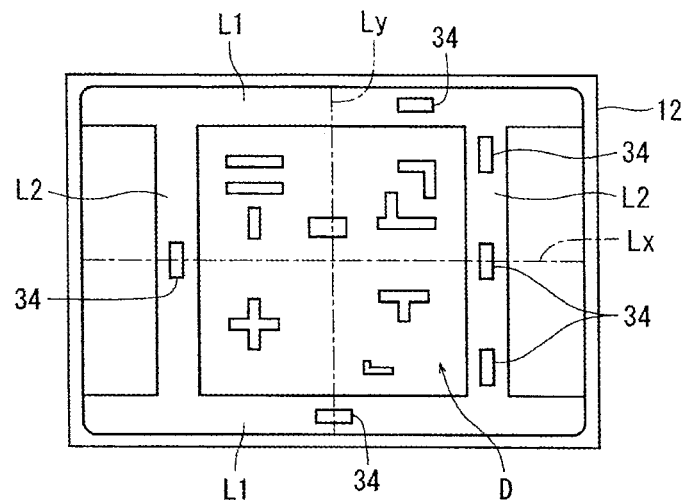
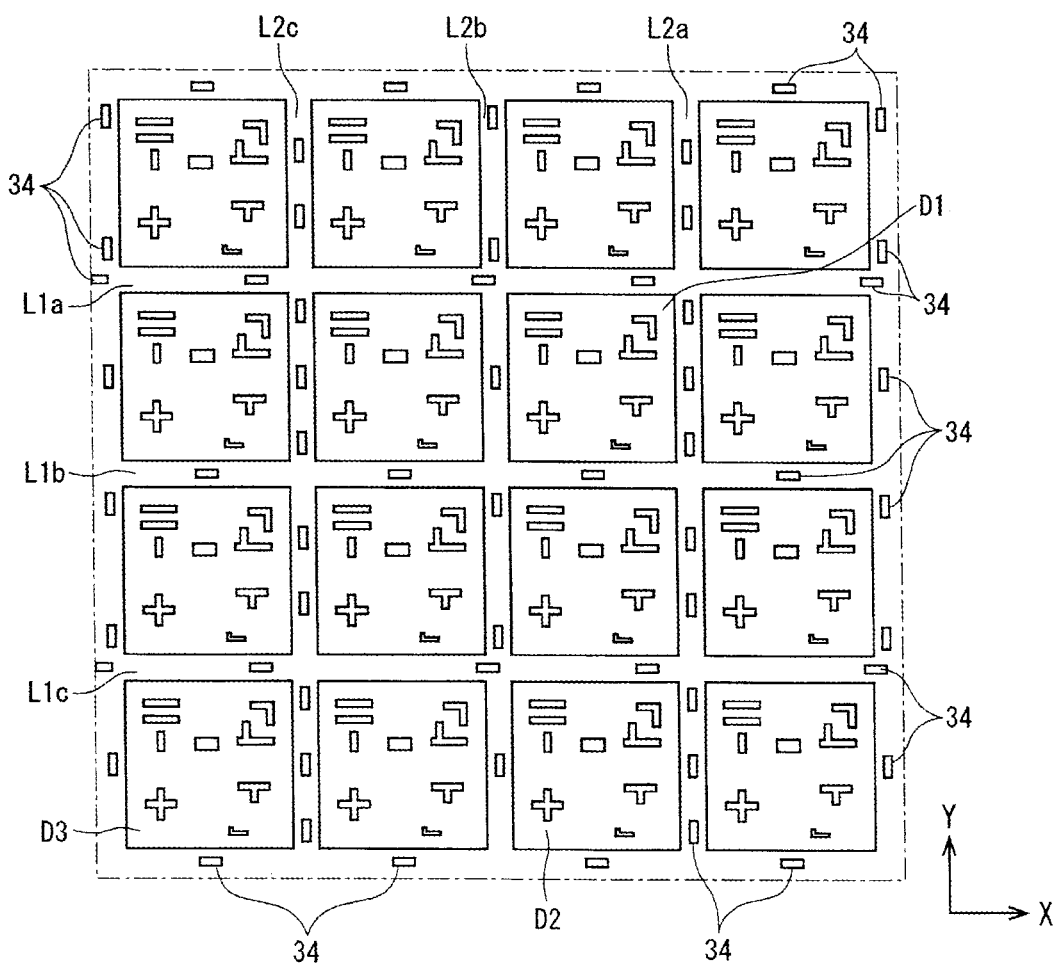

PROCESSING APPARATUS

BACKGROUND OF THE INVENTION

Field of the Invention

The present invention relates to a processing apparatus that can generate a map of a wafer.

Description of the Related Art

A wafer having a plurality of devices such as integrated circuits (ICs) or large-scale integration circuits (LSIs) formed on the top surface of the wafer to be demarcated by a plurality of intersecting planned dividing lines is divided into individual device chips by a dicing apparatus or a laser processing apparatus. Each of the divided device chips is used in an electric apparatus such as a mobile telephone or a personal computer.

The dicing apparatus includes a rotatable chuck table that holds a wafer, a cutting unit including a cutting blade that cuts the wafer held by the chuck table, an X-axis feed mechanism that processing-feeds the chuck table and the cutting unit relative to each other in an X-axis direction, a Y-axis feed mechanism that indexing-feeds the chuck table and the cutting unit relative to each other in a Y-axis direction, an operating unit for operating the X-axis feed mechanism and the Y-axis feed mechanism, an imaging unit that images the wafer held by the chuck table and detects a region to be cut, a display unit that displays a region imaged by the imaging unit, and a control unit.

The dicing apparatus can detect a planned dividing line to be cut by the imaging unit, position the cutting blade at the planned dividing line to cut the wafer, and thus divide the wafer into individual device chips with high accuracy (see, for example, Japanese Patent Laid-Open No. Hei05-315444).

In addition, the laser processing apparatus can also similarly detect a planned dividing line to be laser-processed by the imaging unit, position a condenser for condensing a laser beam at the planned dividing line to irradiate the wafer with the laser beam, and thus divide the wafer into individual device chips with high accuracy (see, for example, Japanese Patent Laid-Open No. 2004-322168).

SUMMARY OF THE INVENTION

After the dicing apparatus or the laser processing apparatus performs processing on the wafer, a processed groove formed in the wafer by cutting processing or laser processing is imaged by the imaging unit, and a processed state is checked. At this time, map information of the wafer is required to select and image a region without test element groups (TEGs) formed by a metallic film on the planned dividing line and a region with TEGs on the planned dividing line.

When a map of the wafer is to be generated, an operator generates the map information of the wafer by manually coupling together a plurality of images captured by the imaging unit, and stores the map information in a storage unit. However, such a work takes a considerable amount of time and is troublesome.

It is accordingly an object of the present invention to provide a processing apparatus that can generate a map of a wafer.

In accordance with an aspect of the present invention, there is provided a processing apparatus for generating a map of a wafer, in which a plurality of devices are demarcated by a plurality of first planned dividing lines extending in a first direction and a plurality of second planned dividing lines extending in a second direction orthogonal to the first direction and TEGs are formed on the first and second planned dividing lines, the processing apparatus including a rotatable chuck table configured to hold the wafer, a processing unit configured to perform processing on the wafer held by the chuck table, an X-axis feed mechanism configured to processing-feed the chuck table and the processing unit relative to each other in an X-axis direction, a Y-axis feed mechanism configured to indexing-feed the chuck table and the processing unit relative to each other in a Y-axis direction which is orthogonal to the X-axis direction, an operating unit for operating the X-axis feed mechanism and the Y-axis feed mechanism, an imaging unit configured to image the wafer held by the chuck table and detect a region to be processed, a display unit configured to display a region imaged by the imaging unit, and a control unit, the control unit including an X-axis direction positioning section configured to detect a linear region corresponding to a first planned dividing line from an intersection region of the first planned dividing line and a second planned dividing line in an image obtained by imaging the wafer held on the chuck table by the imaging unit, obtain an angle between the linear region and the X-axis direction, and position the linear region corresponding to the first planned dividing line in the X-axis direction by rotating the chuck table, a first planned dividing line interval setting section configured to actuate the Y-axis feed mechanism, detect a linear region corresponding to a next first planned dividing line, and set an interval between the first planned dividing lines, a second planned dividing line interval setting section configured to actuate the X-axis feed mechanism, detect two linear regions corresponding to second planned dividing lines, the linear regions being adjacent to each other, and set an interval between the second planned dividing lines, a device image generating section configured to generate and store one device image enclosed by a pair of adjacent first planned dividing lines and a pair of adjacent second planned dividing lines, a reticle image extracting section configured to obtain a plurality of device images while moving the region to be imaged by the imaging unit in the X-axis direction and the Y-axis direction, couple the obtained plurality of device images by phase only correlation, and extract and store a reticle image including a plurality of devices and TEGs, and a map generating section configured to generate the map of the wafer by coupling together a plurality of reticle images by phase only correlation.

Preferably, the map generating section obtains the plurality of reticle images while moving the region to be imaged by the imaging unit in the X-axis direction and the Y-axis direction, and generates the map of the wafer by coupling together the obtained plurality of reticle images by phase only correlation.

According to the present invention, it is possible to easily generate the map of the wafer.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 7 is a schematic diagram of a device image;

FIG. 8 is a schematic diagram of an image obtained by coupling a plurality of device images together;

DETAILED DESCRIPTION OF THE PREFERRED EMBODIMENT

A processing apparatus according to an embodiment of the present invention will hereinafter be described with reference to the drawings.

Figure 1:
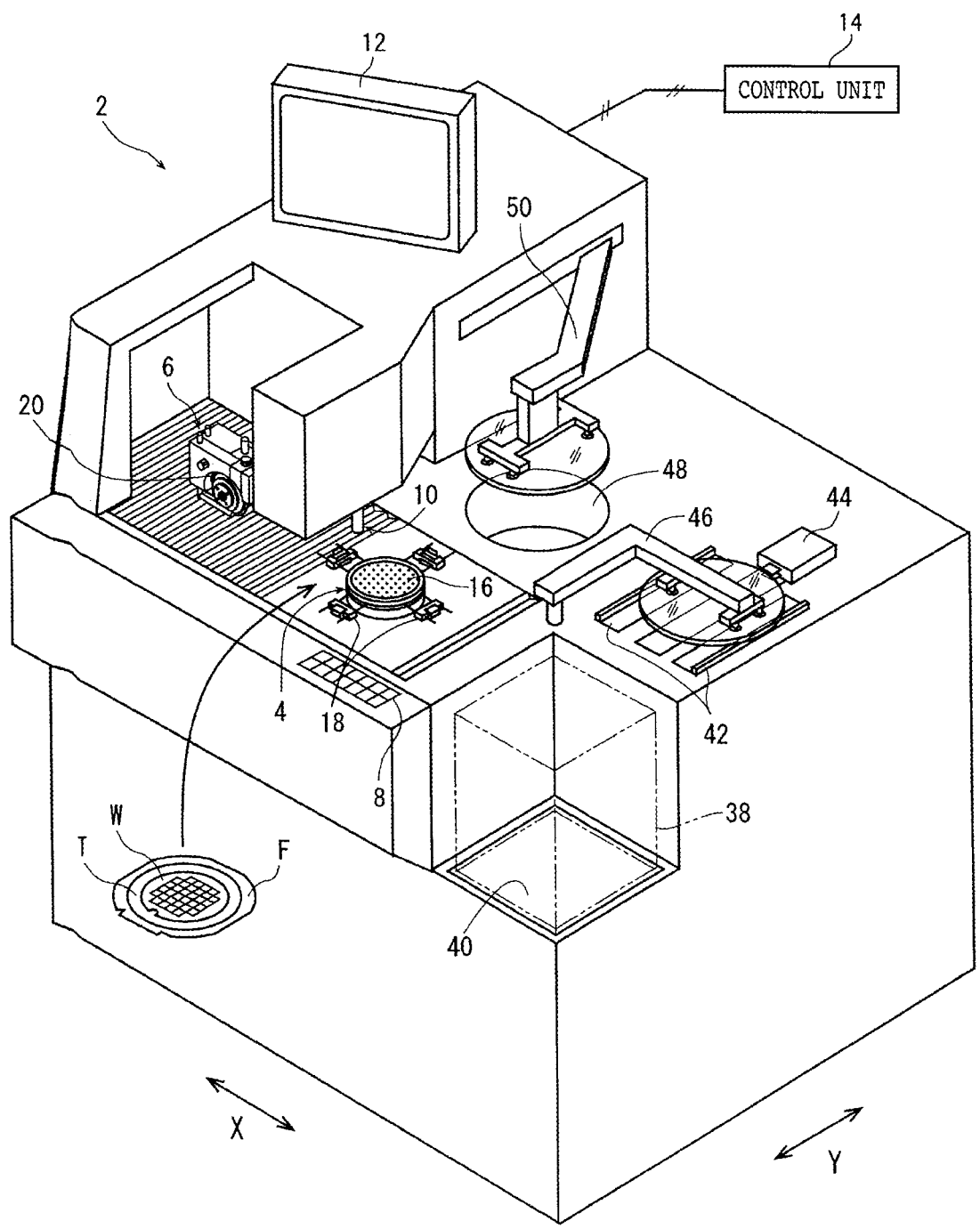
FIG. 1 is a perspective view of a processing apparatus according to an embodiment of the present invention.

The processing apparatus indicated in entirety by a reference numeral 2 in FIG. 1 includes a rotatable chuck table 4 that holds a wafer W, a processing unit 6 that performs processing on the wafer W held by the chuck table 4, an X-axis feed mechanism (not illustrated) that processing-feeds the chuck table 4 and the processing unit 6 relative to each other in an X-axis direction, a Y-axis feed mechanism (not illustrated) that indexing-feeds the chuck table 4 and the processing unit 6 relative to each other in a Y-axis direction, an operating unit 8 for operating the X-axis feed mechanism and the Y-axis feed mechanism, an imaging unit 10 that images the wafer W held by the chuck table 4 and detects a region to be processed, a display unit 12 that displays a region imaged by the imaging unit 10, and a control unit 14 that controls actuation of the processing apparatus 2.

Incidentally, the X-axis direction is a direction indicated by an arrow X in FIG. 1. The Y-axis direction is a direction indicated by an arrow Y in FIG. 1, and is a direction orthogonal to the X-axis direction. In addition, an XY plane defined by the X-axis direction and the Y-axis direction is substantially horizontal.

Figure 2:
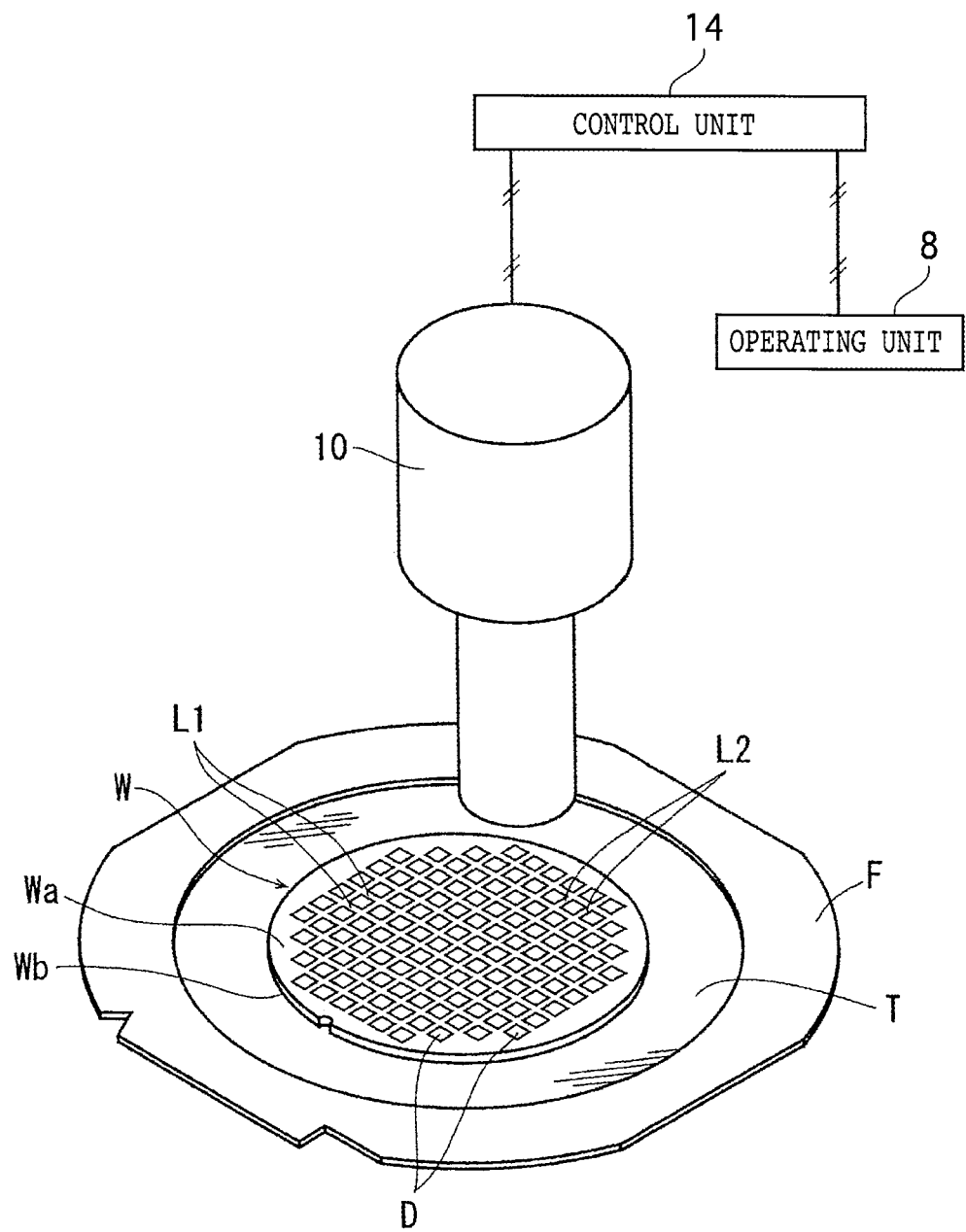
FIG. 2 is a perspective view illustrating a state in which an imaging unit illustrated in FIG. 1 images a wafer.

The wafer W to be processed by the processing apparatus 2 has a disk shape, and can be formed of an appropriate semiconductor material such as silicon. As illustrated in FIG. 2, a top surface Wa of the wafer W is provided with a plurality of planned dividing lines as linear regions, and the plurality of planned dividing lines are combined with each other in a lattice manner as a whole. The planned dividing lines in a lattice shape include a plurality of first planned dividing lines L1 extending in a first direction and second planned dividing lines L2 extending in a second direction orthogonal to the first direction. The first and second planned dividing lines L1 and L2 demarcate the top surface Wa of the wafer W into a plurality of rectangular regions. A device D such as an IC or an LSI is formed in each of the plurality of rectangular regions. In addition, as is understood by reference to FIG. 8, a plurality of TEGs 34 are arranged in a predetermined periodic pattern on each of the first planned dividing lines L1 (L1a, L1b, and L1c) and the second planned dividing lines L2 (L2a, L2b, and L2c).

In addition, as illustrated in FIG. 2, an undersurface Wb of the wafer W illustrated in the figure is affixed to a dicing tape T, and the peripheral edge of the dicing tape T is fixed to an annular frame F. That is, the wafer W is supported by the annular frame F via the dicing tape T.

As illustrated in FIG. 1, a porous circular suction chuck 16 connected to suction means (not illustrated) is disposed in an upper end part of the chuck table 4. The chuck table 4 generates a suction force in the suction chuck 16 by the suction means, and thereby sucks and holds the wafer W mounted on the upper surface of the suction chuck 16. In addition, at the peripheral edge of the chuck table 4, a plurality of clamps 18 for fixing the annular frame F are arranged at intervals in a circumferential direction. Such a chuck table 4 is processing-fed in the X-axis direction by the above-described X-axis feed mechanism, and is rotated by a motor (not illustrated) for the chuck table with an upward-downward direction as an axis.

The processing apparatus 2 in the present embodiment is a dicing apparatus as an example of the processing apparatus according to the present invention. The processing unit 6 is configured as a cutting unit that performs cutting processing on the wafer W. The processing unit (cutting unit) 6 includes an annular cutting blade 20 that cuts the wafer W held under suction by the chuck table 4. The cutting blade 20 is disposed along the X-axis direction, and is configured to be rotatable with the Y-axis direction as an axis.

The X-axis feed mechanism includes a ball screw being coupled to the chuck table 4 and extending in the X-axis direction and a motor that rotates the ball screw. The X-axis feed mechanism converts rotary motion of the motor into rectilinear motion by the ball screw, and transmits the rectilinear motion to the chuck table 4. The X-axis feed mechanism thereby processing-feeds the chuck table 4 in the X-axis direction with respect to the processing unit 6.

The Y-axis feed mechanism includes a ball screw being coupled to the processing unit 6 and extending in the Y-axis direction and a motor that rotates the ball screw. The Y-axis feed mechanism converts rotary motion of the motor into rectilinear motion by the ball screw, and transmits the rectilinear motion to the processing unit 6. The Y-axis feed mechanism thereby indexing-feeds the processing unit 6 in the Y-axis direction with respect to the chuck table 4.

The operating unit 8 includes an input apparatus (for example, a keyboard or a touch panel) for inputting actuation conditions of the X-axis and Y-axis feed mechanisms or the like. The actuation conditions input from the operating unit 8 are sent to the control unit 14. The control unit 14 controls actuation of the X-axis and Y-axis feed mechanisms or the like.

The imaging unit 10 is disposed above the track of the chuck table 4. The imaging unit 10 is coupled to the processing unit 6. The Y-axis feed mechanism indexing-feeds the imaging unit 10 together with the processing unit 6 in the Y-axis direction with respect to the chuck table 4. In addition, the imaging unit 10 allows changing of a magnification thereof at a time of imaging the wafer W held on the chuck table 4.

Figure 4A:
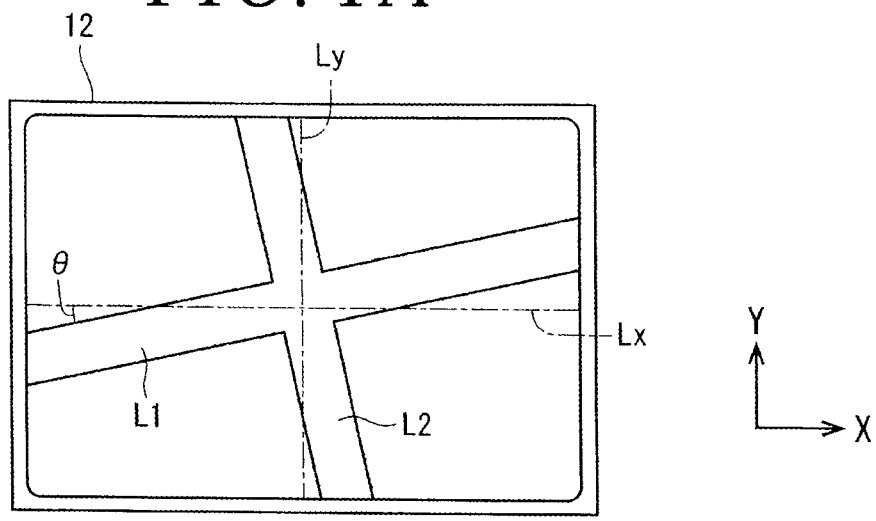
FIG. 4A is a schematic diagram illustrating an image obtained by imaging an intersection region of a first planned dividing line and a second planned dividing line in a state in which an angle formed between the first planned dividing line of the wafer and an X-axis direction is θ.
Figure 4B:
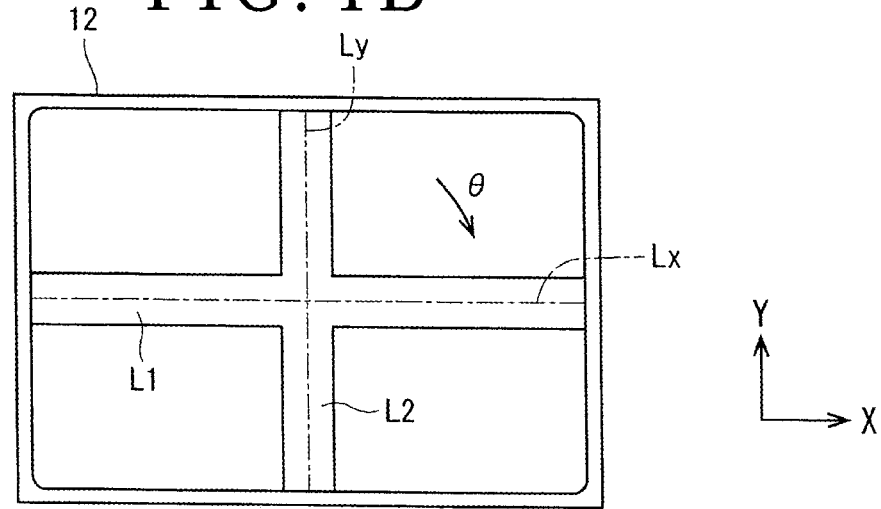
FIG. 4B is a schematic diagram of an image illustrating a state in which a chuck table is rotated by the angle θ from the state illustrated in FIG. 4A.

The display unit 12 is configured to display an X-axis line Lx indicating the X-axis direction and a Y-axis line Ly indicating the Y-axis direction, as illustrated in FIGS. 4A and 4B, in addition to an image captured by the imaging unit 10. The X-axis line Lx is displayed along a horizontal direction in a center in a vertical direction of the display unit 12. The Y-axis line Ly is displayed along the vertical direction in a center in the horizontal direction of the display unit 12.

Though not illustrated, the control unit 14 constituted by a computer includes a central processing unit (CPU) that performs arithmetic processing according to a control program; a read-only memory (ROM) that stores the control program and the like; and a readable and writable random access memory (RAM) that stores an arithmetic result and the like.

Figure 3:
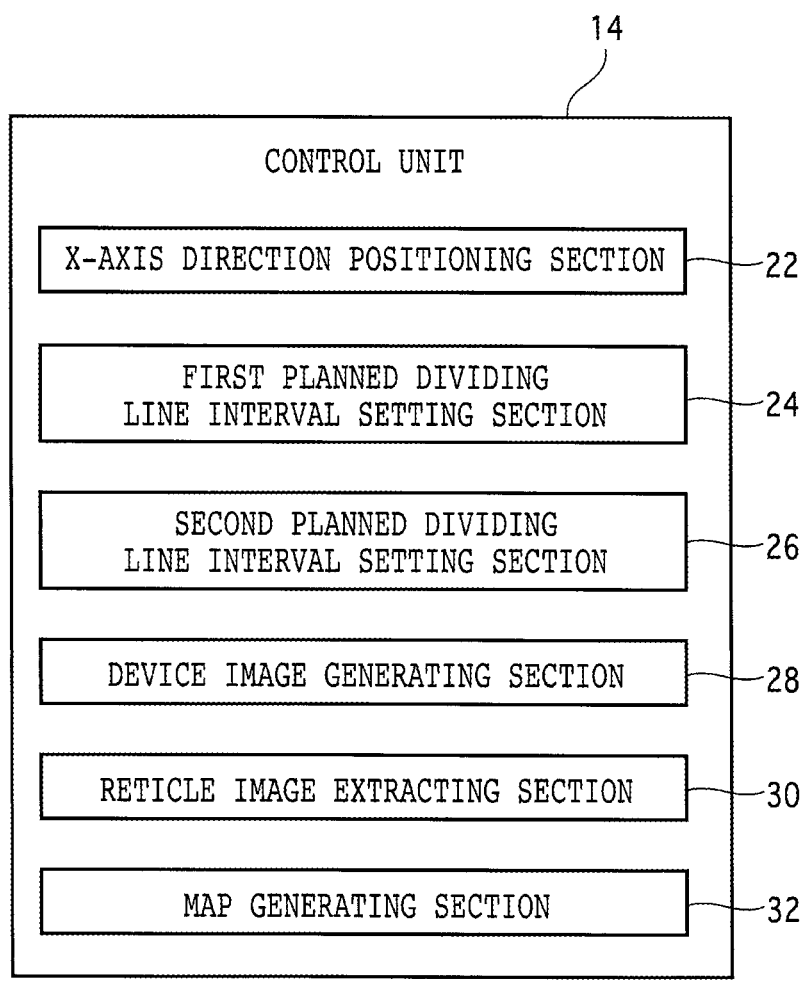
FIG. 3 is a block diagram illustrating a configuration of a control unit illustrated in FIG. 1.

As illustrated in FIG. 3, the control unit 14 includes an X-axis direction positioning section 22, a first planned dividing line interval setting section 24, a second planned dividing line interval setting section 26, a device image generating section 28, a reticle image extracting section 30, and a map generating section 32.

The X-axis direction positioning section 22 detects a linear region corresponding to a first planned dividing line L1 from an intersection region of the first planned dividing line L1 and a second planned dividing line L2 in an image obtained by imaging the wafer W held on the chuck table 4 by the imaging unit 10, obtains an angle between the detected linear region and the X-axis direction, and rotates the chuck table 4 by an amount of the obtained angle. The X-axis direction positioning section 22 thus positions the linear region corresponding to the first planned dividing line L1 in the X-axis direction. Incidentally, the X-axis direction positioning section 22 is configured to detect the linear region by a publicly known technology such as Hough transform.

The first planned dividing line interval setting section 24 is configured to actuate the Y-axis feed mechanism while imaging the wafer W by the imaging unit 10, detect a linear region corresponding to a next first planned dividing line L1, and determine and set an interval between the first planned dividing lines L1.

The second planned dividing line interval setting section 26 actuates the X-axis feed mechanism while imaging the wafer W by the imaging unit 10, detects two linear regions adjacent to each other which linear regions correspond to second planned dividing lines L2, and determines and sets an interval between the second planned dividing lines L2. Incidentally, as with the X-axis direction positioning section 22, the first and second planned dividing line interval setting sections 24 and 26 also detect the linear regions by Hough transform or the like.

The device image generating section 28 generates a device image (see FIG. 7) by imaging, by the imaging unit 10, a region including one device D enclosed by a pair of first planned dividing lines L1 adjacent to each other and a pair of second planned dividing lines L2 adjacent to each other. The device image generating section 28 then stores the generated device image. The device image referred to here includes the pair of first planned dividing lines L1 and the pair of second planned dividing lines L2 each present on the periphery of the device D. That is, the device image includes TEGs 34 present on the periphery of the device D.

The reticle image extracting section 30 obtains a plurality of device images by imaging the wafer W by the imaging unit 10 while moving the region to be imaged by the imaging unit 10 in the X-axis direction and the Y-axis direction by the X-axis feed mechanism and the Y-axis feed mechanism. In addition, the reticle image extracting section 30 couples the obtained plurality of device images by phase only correlation (see FIG. 8), extracts a reticle image 52 (see FIG. 9) including a plurality of devices D and TEGs 34, and stores the reticle image 52. Incidentally, the phase only correlation is a publicly known image processing technology, and hence, description thereof will be omitted in the present specification.

Figure 10:
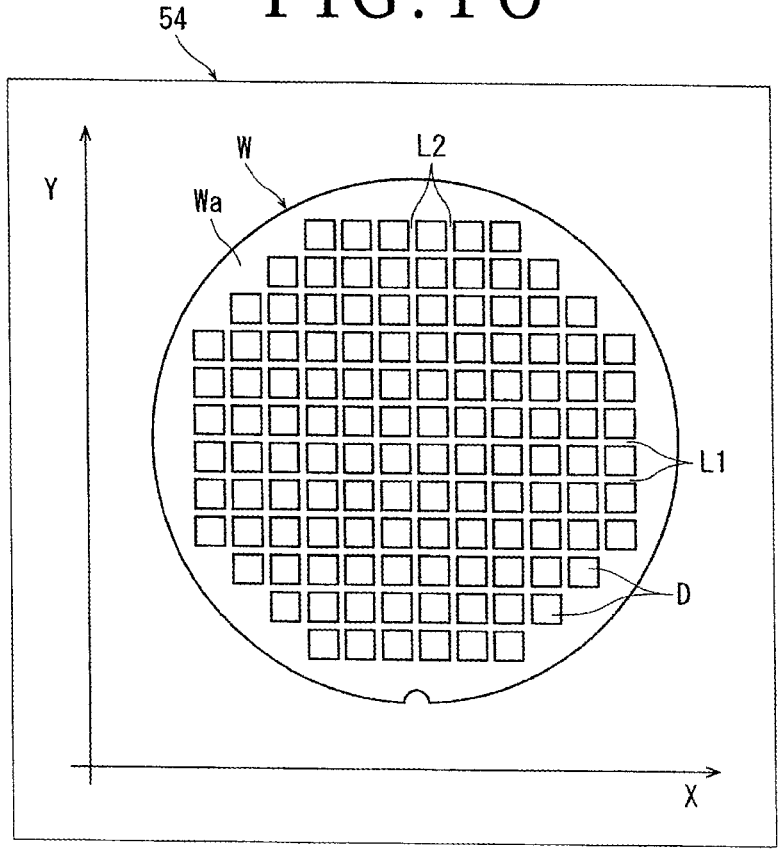
FIG. 10 is a schematic diagram of a wafer map.

The map generating section 32 obtains a plurality of reticle images 52 by imaging the wafer W by the imaging unit 10 while moving the region to be imaged by the imaging unit 10 in the X-axis direction and the Y-axis direction by the X-axis feed mechanism and the Y-axis feed mechanism. In addition, the map generating section 32 generates a map 54 (see FIG. 10) of the wafer W by coupling together the obtained plurality of reticle images 52 by phase only correlation. Incidentally, in FIG. 10, device images and TEG images are omitted.

As illustrated in FIG. 1, the processing apparatus 2 further includes a raisable and lowerable cassette table 40 on which a cassette 38 housing a plurality of wafers W is placed; a loading and unloading mechanism 44 that extracts a wafer W that has not yet been processed from the cassette 38 to unload the wafer W to a temporary placement table 42 and loads the already processed wafer W that is positioned on the temporary placement table 42 into the cassette 38; a first transporting mechanism 46 that transports, to the chuck table 4, the wafer W that has not yet been processed and that is unloaded from the cassette 38 to the temporary placement table 42; a cleaning unit 48 that cleans the already processed wafer W; and a second transporting mechanism 50 that transports the already processed wafer W from the chuck table 4 to the cleaning unit 48.

Description will next be made of a method of generating a map of the wafer W by using the processing apparatus 2 described above.

An operator first makes the chuck table 4 hold under suction a wafer W with the top surface Wa oriented upward, on which top surface the first and second planned dividing lines L1 and L2 are formed, and fixes the annular frame F by the plurality of clamps 18. Next, the operator actuates the X-axis feed mechanism by operating the operating unit 8, and thereby moves the wafer W held on the chuck table 4 to a position below the imaging unit 10. Then, the operator operates the operating unit 8 to image an intersection region of a first planned dividing line L1 and a second planned dividing line L2 by the imaging unit 10.

Then, an image captured by the imaging unit 10 is sent from the imaging unit 10 to the control unit 14. Next, the X-axis direction positioning section 22 of the control unit 14 detects a linear region corresponding to the first planned dividing line L1 in the image sent from the imaging unit 10. In addition, the X-axis direction positioning section 22 obtains an angle θ (see FIG. 4A) between the detected first planned dividing line L1 and the X-axis direction. Then, when the obtained angle θ is not 0°, the X-axis direction positioning section 22 rotates the chuck table 4 by the angle θ, and thereby positions the linear region corresponding to the first planned dividing line L1 in the X-axis direction, as illustrated in FIG. 4B.

After the linear region corresponding to the first planned dividing line L1 is positioned in the X-axis direction, the first planned dividing line interval setting section 24 of the control unit 14 performs control.

Figure 5:
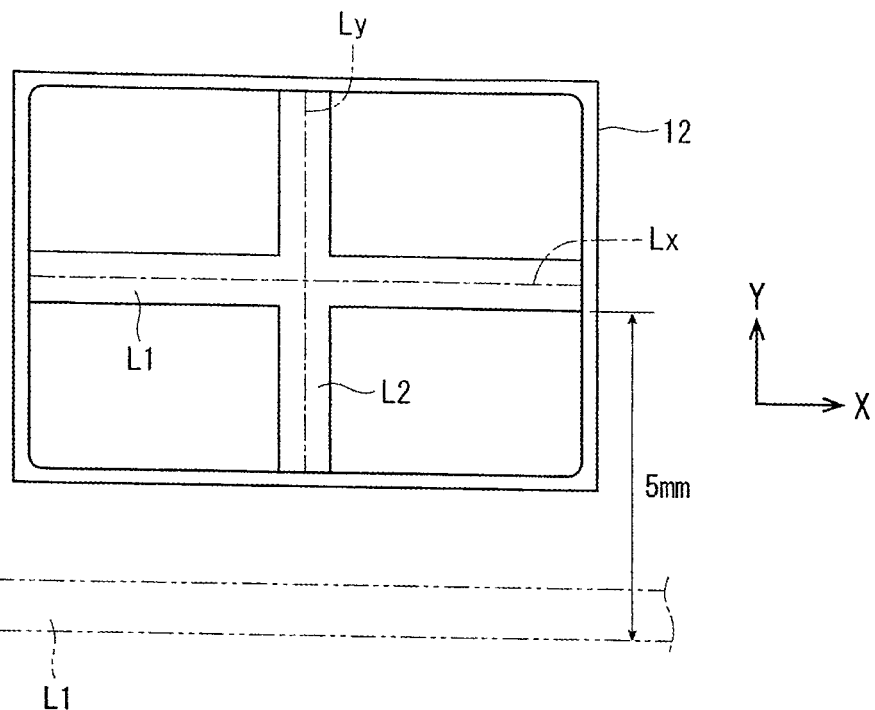
FIG. 5 is a schematic diagram illustrating a state in which an interval between first planned dividing lines is set.

Specifically, the first planned dividing line interval setting section 24 actuates the Y-axis feed mechanism and the imaging unit 10, and thereby images the wafer W held on the chuck table 4 by the imaging unit 10 while moving the imaging unit 10 in the Y-axis direction. As illustrated in FIG. 5, the first planned dividing line interval setting section 24 thereby detects a linear region corresponding to a next first planned dividing line L1 adjacent to the first planned dividing line L1 previously detected by the X-axis direction positioning section 22.

In FIG. 5, the first planned dividing line L1 previously detected by the X-axis direction positioning section 22 is outside a display region of the display unit 12, and is hence represented by a chain double-dashed line (imaginary line). On the other hand, the first planned dividing line L1 detected next by the first planned dividing line interval setting section 24 is within the display region of the display unit 12, and is hence represented by a solid line.

Next, from the first planned dividing line L1 detected previously and the first planned dividing line L1 detected next, the first planned dividing line interval setting section 24 obtains an interval (for example, 5 mm) between the first planned dividing lines L1. The first planned dividing line interval setting section 24 then sets the obtained interval as an interval between the first planned dividing lines L1.

Figure 6:
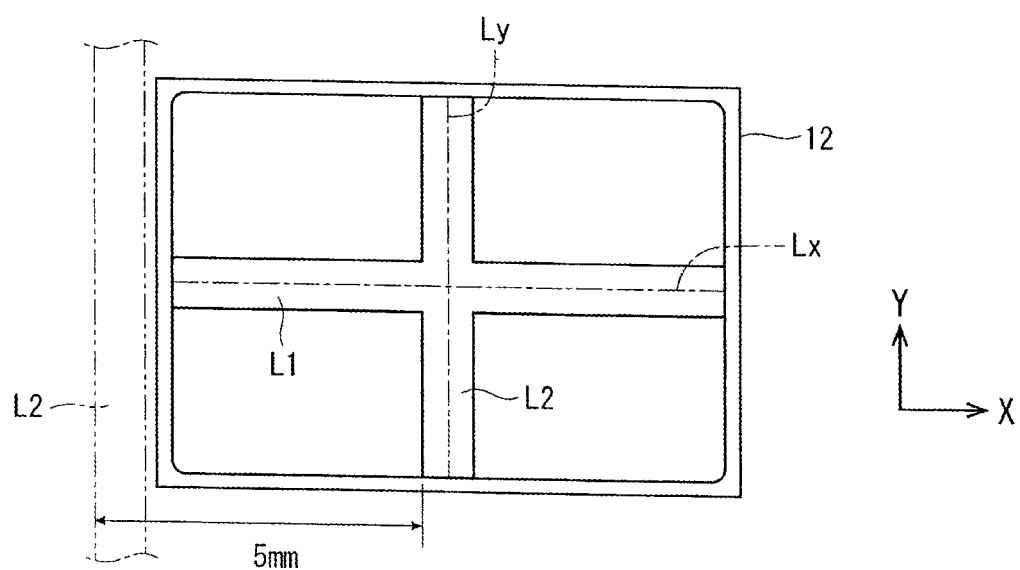
FIG. 6 is a schematic diagram illustrating a state in which an interval between second planned dividing lines is set.

After the interval between the first planned dividing lines L1 is set, the second planned dividing line interval setting section 26 performs control. The second planned dividing line interval setting section 26 actuates the X-axis feed mechanism and the imaging unit 10, and thereby images the wafer W by the imaging unit 10 while moving the chuck table 4 in the X-axis direction. Then, as illustrated in FIG. 6, the second planned dividing line interval setting section 26 detects two linear regions adjacent to each other which linear regions correspond to second planned dividing lines L2, obtains an interval (for example, 5 mm) between the second planned dividing lines L2, and sets the obtained interval as an interval between the second planned dividing lines L2.

After the interval between the second planned dividing lines L2 is set, the device image generating section 28 performs control. The device image generating section 28 actuates the imaging unit 10 together with the X-axis and Y-axis feed mechanisms, and thereby adjusts positional relation between the wafer W and the imaging unit 10 and images, by the imaging unit 10, a region including one device D enclosed by a pair of first planned dividing lines L1 adjacent to each other and a pair of second planned dividing lines L2 adjacent to each other. As is understood by reference to FIG. 7, an imaging region of the imaging unit 10 in this case includes TEGs 34 present on the periphery of the device D together with the device D. Then, in reference to an image captured by the imaging unit 10, the device image generating section 28 generates an image (device image) of the device D including the TEGs 34 present on the periphery of the device D. The device image generating section 28 then stores the device image.

After the device image is generated, the reticle image extracting section 30 performs control. The reticle image extracting section 30 first actuates the Y-axis feed mechanism and the imaging unit 10, and thereby obtains a plurality of device images while moving the region to be imaged by the imaging unit 10 in the Y-axis direction.

Specifically, the reticle image extracting section 30 sets, as a reference, the device D imaged at a time of the control by the device image generating section 28 (which device will hereinafter be referred to as a "reference device D"), for example, and moves, by the Y-axis feed mechanism, the imaging unit 10 in the Y-axis direction by the interval between the first planned dividing lines L1. The imaging region of the imaging unit 10 is thereby positioned at a next device D located next to the reference device D in the Y-axis direction. The imaging region at this time includes TEGs 34 present on the periphery of the next device D. Next, the reticle image extracting section 30 images, by the imaging unit 10, a region including the next device D and the TEGs 34 on the periphery of the next device D, and thereby obtains a device image of the next device D.

Then, the reticle image extracting section 30 images devices D arranged in the same column as the reference device D in order in the Y-axis direction by the imaging unit 10 while moving, by the Y-axis feed mechanism, the imaging unit 10 by the interval between the first planned dividing lines L1. The reticle image extracting section 30 thereby obtains a plurality of device images. In addition, the reticle image extracting section 30 compares the obtained device images with the device image of the reference device D, and determines whether or not an obtained device image is identical to the device image of the reference device D. Such control is performed until a device image identical to the device image including the reference device D is obtained. It is thereby possible to detect a periodic pattern of TEGs 34 between the plurality of first planned dividing lines L1.

As described above, TEGs 34 are arranged in a predetermined periodic pattern on the first and second planned dividing lines L1 and L2. However, the arrangement of TEGs 34 included in a device image is not necessarily common to all of the device images.

For example, as illustrated in FIG. 8, an arrangement pattern of TEGs 34 on a first planned dividing line L1a is different from an arrangement pattern of TEGs 34 on a first planned dividing line L1b next to the first planned dividing line L1a. In addition, an arrangement pattern of TEGs 34 on a second planned dividing line L2a is different from an arrangement pattern of TEGs 34 on a second planned dividing line L2b next to the second planned dividing line L2a. Thus, though the TEGs 34 are arranged in a predetermined periodic pattern, not all of the TEGs 34 are arranged at the same intervals.

In the present embodiment, supposing that a device indicated by a reference numeral D1 in FIG. 8, for example, is a reference device, the arrangement of TEGs 34 in a device image including a device D2 two rows below the reference device D1 is identical to the arrangement of TEGs 34 in a device image including the reference device D1. That is, in the present embodiment, the arrangement of TEGs 34 on the first planned dividing line L1a is identical to the arrangement of TEGs 34 on a first planned dividing line L1c two rows below the first planning dividing line L1a.

After obtaining a device image identical to the device image including the reference device D1, the reticle image extracting section 30 actuates the X-axis feed mechanism and the imaging unit 10, and thereby obtains a plurality of device images while moving the region to be imaged by the imaging unit 10 in the X-axis direction.

Specifically, the reticle image extracting section 30, for example, sets the device D2 as a reference, and moves, by the X-axis feed mechanism, the chuck table 4 in the X-axis direction by the interval between the second planned dividing lines L2. The imaging region of the imaging unit 10 is thereby positioned at a next device D located next to the device D2 in the X-axis direction. The imaging region at this time includes TEGs 34 present on the periphery of the next device D. Next, the reticle image extracting section 30 images a region including the next device D and the TEGs 34 on the periphery of the next device D by the imaging unit 10, and thereby obtains a device image of the next device D.

Then, the reticle image extracting section 30 images devices D arranged in the same row as the device D2 in order in the X-axis direction by the imaging unit 10 while moving, by the X-axis feed mechanism, the chuck table 4 by the interval between the second planned dividing lines L2. The reticle image extracting section 30 thereby obtains a plurality of device images. In addition, the reticle image extracting section 30 compares the obtained device images with the device image of the device D2, and determines whether or not an obtained device image is identical to the device image of the device D2. Such control is performed until a device image identical to the device image including the device D2 is obtained. It is thereby possible to detect a periodic pattern of TEGs 34 between the plurality of second planned dividing lines L2.

In the present embodiment, the arrangement of TEGs 34 in a device image including a device D3 two columns left to the device D2 in FIG. 8 is identical to the arrangement of TEGs 34 in the device image including the device D2. That is, in the present embodiment, the arrangement of TEGs 34 on the second planned dividing line L2a is identical to the arrangement of TEGs 34 on a second planned dividing line L2c two columns left to the second planned dividing line L2a.

Incidentally, the present embodiment first images the devices D arranged in the Y-axis direction, and then images the devices D arranged in the X-axis direction. However, conversely, the devices D arranged in the Y-axis direction may be imaged after the devices D arranged in the X-axis direction are imaged.

Figure 9:
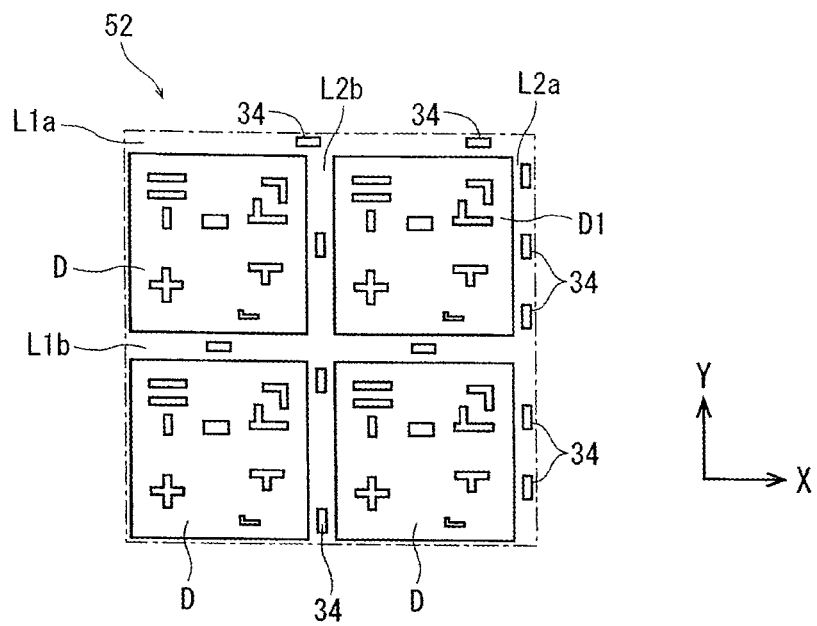
FIG. 9 is a schematic diagram of a reticle image.

After obtaining the device image identical to the device image including the device D2, the reticle image extracting section 30 couples together the obtained plurality of device images by phase only correlation, and extracts a reticle image 52 including a plurality of devices D and TEGs 34 as illustrated in FIG. 9. The reticle image 52 is an image illustrating one element of a periodic pattern (which element will hereinafter be referred to as a "unit reticle") on the top surface Wa of the wafer W.

In the present embodiment, as described above, the arrangement of TEGs 34 on the first planned dividing lines L1a and L1c are identical, and the arrangements of TEGs 34 on the second planned dividing lines L2a and L2c are identical. Therefore, as illustrated in FIG. 9, extracted is the reticle image 52 which includes the two first planned dividing lines L1a and L1b, the two second planned dividing lines L2a and L2b, and four devices D.

The reticle image 52 illustrated in FIG. 9 is obtained by coupling four device images together by phase only correlation. However, the number of devices D included in the reticle image is not limited to four, and any number of devices D can be included in the reticle image according to the periodic pattern of TEGs 34.

After the reticle image 52 is extracted by the reticle image extracting section 30, the map generating section 32 performs control. The map generating section 32 first positions the imaging region of the imaging unit 10 at any unit reticle (for example, a unit reticle including the reference device D1). Next, the map generating section 32 images unit reticles arranged in the X-axis direction in order while moving the imaging region of the imaging unit 10 in the X-axis direction by an amount of a width in the X-axis direction of the unit reticle. The map generating section 32 thereby obtains a plurality of reticle images 52.

When the imaging region of the imaging unit 10 reaches the peripheral edge of the wafer W, the imaging region of the imaging unit 10 is moved in the Y-axis direction by an amount of a width in the Y-axis direction of the unit reticle. Thereafter, unit reticles arranged in the X-axis direction are imaged in order while the imaging region of the imaging unit 10 is moved in the X-axis direction again by the amount of the width in the X-axis direction of the unit reticle. A plurality of reticle images 52 are thereby obtained. This is repeatedly performed to obtain images of all of the unit reticles on the wafer W (reticle images 52).

Incidentally, unit reticles may be imaged in order while the imaging region of the imaging unit 10 is moved in the Y-axis direction, and when the imaging region of the imaging unit 10 reaches the peripheral edge of the wafer W, the imaging region of the imaging unit 10 may be moved in the X-axis direction.

Then, the map generating section 32 generates a map 54 (see FIG. 10) of the wafer W by coupling together all of the obtained reticle images 52 by phase only correlation. Thus, the map generating section 32 according to the present embodiment is configured to obtain a plurality of reticle images 52 while moving the region to be imaged by the imaging unit 10 in the X-axis direction and the Y-axis direction, and generate the map 54 of the wafer W by coupling together the obtained plurality of reticle images 52 by phase only correlation.

Alternatively, the map generating section 32 may obtain the plurality of reticle images 52 by duplicating the reticle image 52 extracted by the reticle image extracting section 30, next couple together the obtained plurality of reticle images 52 into a square-shaped image by phase only correlation, and thereafter generate the map 54 of the wafer W by cutting the coupled square-shaped image into a circular shape in correspondence with the diameter of the wafer W.

As described above, the processing apparatus 2 generates the map 54 of the wafer W by performing control in reference to an image of an intersection region of a first planned dividing line L1 and a second planned dividing line L2. Thus, it is unnecessary for the operator to generate map information of the wafer W by coupling together a plurality of images captured by the imaging unit 10, and store the map information in a storage unit. The problem of such trouble is therefore solved.

It is to be noted that, while in the present embodiment, description has been made of an example in which the processing apparatus 2 is configured as a dicing apparatus that performs cutting processing on the wafer W, it suffices for the processing apparatus according to the present invention to perform processing on the wafer W. For example, the processing apparatus according to the present invention can be configured as a laser processing apparatus that performs laser processing on the wafer W.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing apparatus for generating a map of a wafer, in which a plurality of devices are demarcated by a plurality of first planned dividing lines extending in a first direction and a plurality of second planned dividing lines extending in a second direction orthogonal to the first direction and test element groups are formed on the first and second planned dividing lines, the processing apparatus comprising:
   a rotatable chuck table configured to hold the wafer;
   a processing unit configured to perform processing on the wafer held by the chuck table;
   an X-axis feed mechanism configured to processing-feed the chuck table and the processing unit relative to each other in an X-axis direction;

a Y-axis feed mechanism configured to indexing-feed the chuck table and the processing unit relative to each other in a Y-axis direction which is orthogonal to the X-axis direction;

an operating unit for operating the X-axis feed mechanism and the Y-axis feed mechanism;

an imaging unit configured to image the wafer held by the chuck table and detect a region to be processed;

a display unit configured to display a region imaged by the imaging unit; and a control unit;

the control unit including an X-axis direction positioning section configured to detect a linear region corresponding to a first planned dividing line from an intersection region of the first planned dividing line and a second planned dividing line in an image obtained by imaging the wafer held on the chuck table by the imaging unit, obtain an angle between the linear region and the X-axis direction, and position the linear region corresponding to the first planned dividing line in the X-axis direction by rotating the chuck table, a first planned dividing line interval setting section configured to actuate the Y-axis feed mechanism, detect a linear region corresponding to a next first planned dividing line, and set an interval between the first planned dividing lines, a second planned dividing line interval setting section configured to actuate the X-axis feed mechanism, detect two linear regions corresponding to second planned dividing lines, the linear regions being adjacent to each other, and set an interval between the second planned dividing lines, a device image generating section configured to generate and store one device image enclosed by a pair of adjacent first planned dividing lines and a pair of adjacent second planned dividing lines, a reticle image extracting section configured to obtain a plurality of device images while moving the region to be imaged by the imaging unit in the X-axis direction and the Y-axis direction, couple the obtained plurality of device images by phase only correlation, and extract and store a reticle image including a plurality of devices and test element groups, and a map generating section configured to generate the map of the wafer by coupling together a plurality of reticle images by phase only correlation.

2. The processing apparatus according to claim 1, wherein the map generating section obtains the plurality of reticle images while moving the region to be imaged by the imaging unit in the X-axis direction and the Y-axis direction, and generates the map of the wafer by coupling together the obtained plurality of reticle images by phase only correlation.

\* \* \* \* \*